US012074081B2

United States Patent
Roemer et al.

(10) Patent No.: US 12,074,081 B2
(45) Date of Patent: Aug. 27, 2024

(54) USE OF BIMETALS IN A HEAT SINK TO BENEFIT HEAT TRANSFER FROM HIGH TEMPERATURE INTEGRATED CIRCUIT COMPONENTS ON A CIRCUIT BOARD

(71) Applicant: Cisco Technology, Inc., San Jose, CA (US)

(72) Inventors: Madeline Marie Roemer, Los Altos, CA (US); Mahesh Daisy, Folsom, CA (US); Jerome Henry, Pittsboro, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 460 days.

(21) Appl. No.: 17/333,642

(22) Filed: May 28, 2021

(65) Prior Publication Data

US 2022/0384301 A1    Dec. 1, 2022

(51) Int. Cl.
*H01L 23/367* (2006.01)
*H01L 23/373* (2006.01)
*H05K 1/02* (2006.01)

(52) U.S. Cl.
CPC ...... *H01L 23/3675* (2013.01); *H01L 23/3735* (2013.01); *H05K 1/0209* (2013.01); *H05K 2201/066* (2013.01)

(58) Field of Classification Search
CPC ...... F28D 15/0233; F28D 20/02; F28D 21/00; F28D 21/081; F28F 13/00; F28F 27/02; F28F 2255/04; H01L 23/3735; H01L 23/427; H01L 23/373; H01L 23/3737; H05K 7/20; H05K 7/20154;
(Continued)

(56) References Cited

U.S. PATENT DOCUMENTS 5,172,755 A * 12/1992 Samarov ............... H05K 3/0061
165/185
6,330,157 B1 * 12/2001 Bezama ................ H01L 23/473
361/689
(Continued)

FOREIGN PATENT DOCUMENTS

EP    3157054 A1 *  4/2017 ......... H01L 23/4093
EP    3157054 A1     4/2017
(Continued)

OTHER PUBLICATIONS

WO-2018185410-A1 English Translation (Year: 2018).*
(Continued)

*Primary Examiner* — Amir A Jalali
(74) *Attorney, Agent, or Firm* — Edell, Shapiro & Finnan, LLC (57) ABSTRACT

An apparatus includes a printed circuit board (PCB), an integrated circuit (IC) component connected with a surface of the PCB, and a heat sink. The heat sink includes a base plate disposed directly over the IC component, and a plurality of cooling fins extending transversely from the base plate. The heat sink includes at least one component including a bimetallic material that distorts when heated above a threshold temperature so as to modify a flow of air directed toward and contacting the cooling fins or maintain contact between a surface of the IC component and a facing surface of the base plate.

20 Claims, 10 Drawing Sheets

(58) Field of Classification Search
CPC .......... H05K 7/20336; H05K 7/20854; H05K 7/2039; H05K 7/2029; H05K 1/0209; G06F 1/20; G06F 1/16; G06F 1/203; G06F 1/636

See application file for complete search history.

(56) References Cited

U.S. PATENT DOCUMENTS

| | | | |
|---|---|---|---|
| 2004/0256720 A1 | 12/2004 | Yap et al. | |
| 2005/0121775 A1 | 6/2005 | Fitzgerald et al. | |
| 2007/0169928 A1* | 7/2007 | Dayan | H01L 23/34 257/E23.099 |
| 2009/0321044 A1* | 12/2009 | Hernon | H01L 23/34 165/80.2 |
| 2014/0360699 A1* | 12/2014 | van Schoor | H01L 23/467 165/96 |
| 2018/0240730 A1* | 8/2018 | Hirao | H01L 21/4817 |
| 2019/0162484 A1* | 5/2019 | Schlottig | H01L 23/3733 |
| 2020/0229318 A1 | 7/2020 | Grau et al. | |
| 2020/0301486 A1* | 9/2020 | Zhang | G06F 1/203 |
| 2020/0355442 A1* | 11/2020 | Lewis | F03G 7/065 |
| 2021/0257271 A1* | 8/2021 | Kuzmenka | H01L 23/3672 |

FOREIGN PATENT DOCUMENTS

| | | | | |
|---|---|---|---|---|
| FR | 2506913 A1 | * | 12/1982 | ............. A01G 9/222 |
| KR | 20120079290 A | * | 7/2012 | ............... G06F 1/20 |
| WO | 2017121111 A1 | | 7/2017 | |
| WO | WO-2018185410 A1 | * | 10/2018 | ............. F28F 1/128 |

OTHER PUBLICATIONS

KR-20120079290-A English Translation (Year: 2012).*
EP-3157054-A1 English Translation (Year: 2017).*
FR-2506913-A1 English Translation (Year: 1982).*
MinebeaMisumi, "Fan Engineering", https://nmbtc.com/fan-engineering/, downloaded from Internet May 26, 2021, 2 pages.
Hao Tian, et al., "A new mathematical model for multi-scale thermal management of data centers using entransy theory", Building Simulation, https://link.springer.com/article/10.1007/s12273-018-0479-z, downloaded Nov. 1, 2018, 14 pages.
Engineered Materials Solutions, "Thermostatic Bimetal Designer's Guide", downloaded Mar. 21, 2016, 50 pages.

* cited by examiner

USE OF BIMETALS IN A HEAT SINK TO BENEFIT HEAT TRANSFER FROM HIGH TEMPERATURE INTEGRATED CIRCUIT COMPONENTS ON A CIRCUIT BOARD

TECHNICAL FIELD

The present disclosure relates to cooling of high temperature integrated circuit components on a circuit board, such as high power density ASIC devices.

BACKGROUND

With increasing networking speeds associated with electronic devices, there is a corresponding increase in power consumption associated with printed circuit board (PCB) components such as the Application Specific Integrated Circuit (ASIC) and other modules (e.g., optical modules, memory modules, etc.). Ensuring adequate thermal management of these components using heat sinks can become critical to achieve efficient operation for long periods of time and based upon limited Rack unit (RU) height restrictions (e.g., 1 RU is typically 1.75 inches (4.45 cm) by 19 inches (48.26 cm)).

Heat sink design is continually optimized, but the ability to evacuate heat in a confined volume has its limits. In current architectures, airflow channels are made of plastics and sheet metals that divide the system into fixed volumes dedicated to cooling one heat source in the system (e.g. Power Supply, Main System ASIC). They are unable to adapt to the environment they are in. Certain systems designed for changing airflow dynamically based upon increasing heat sink temperatures include dynamically changing a fan blade angle and/or position, and fan speed (e.g., increasing air flow when needed). However, such systems rely on certain feedback elements, such as one or more sensors to relay heat level to a motor. Such elements can become a possible point of failure during cooling of the system components.

It would be desirable to provide a heat sink configuration that effectively and dynamically balances airflow and/or heat transfer from system components (e.g., a main ASIC) according to the cooling needs of the system, thus accelerating airflow and/or enhancing heat transfer when heat increases, and reducing airflow (thus saving power) when heat decreases.

DESCRIPTION OF EXAMPLE EMBODIMENTS

Overview

In an embodiment, an apparatus comprises a printed circuit board (PCB), an integrated circuit (IC) component connected with a surface of the PCB, and a heat sink. The heat sink comprises a base plate disposed directly over the IC component, and a plurality of cooling fins extending transversely from the base plate. The heat sink includes at least one component comprising a bimetallic material that distorts when heated above a threshold temperature so as to modify a flow of air directed toward and contacting the cooling fins or maintain contact between a surface of the IC component and a facing surface of the base plate.

In another embodiment, an apparatus comprises a printed circuit board (PCB), an integrated circuit (IC) component connected with a surface of the PCB, and a heat sink. The heat sink comprises a base plate and a plurality of cooling fins disposed over the IC component, and a pair of diverters comprising a first diverter and a second diverter, each of the first and second diverters comprising a bimetallic material and extending along the PCB and oriented along a side of the IC component so as to control a direction of a flow of air between the first and second diverters toward the cooling fins. The bimetallic material of each of the first and second diverters bends when heated above a threshold temperature so as to force a free end of the first diverter away from a free end of the second diverter to modify a flow of air directed toward and contacting the cooling fins.

In a further embodiment, an apparatus comprises a printed circuit board (PCB), an integrated circuit (IC) component connected with a surface of the PCB, and a heat sink. The heat sink comprises a base plate and a plurality of cooling fins disposed directly over the IC component, and a top plate extending over the cooling fins. At least one of the base plate and the top plate comprises a bimetallic material that distorts when heated above a threshold temperature so as to enhance heat transfer between the IC component and the heat sink.

The apparatus can be implemented as a high speed router, switch, networking device or any other electronic device utilizing high speed and high heat generating IC components.

Example Embodiments

A heat sink system or structure that effectively cools high power integrated circuit (IC) components, such as an application specific integrated circuit (ASIC), incorporates bimetallic materials into one or more portions of the heat sink so as to dynamically modify airflow across the heat sink and/or dynamically enhance heat transfer between the heat sink and an IC component when significant changes in temperature of the IC component occur during operations. In particular, no electrical feedback control is required to dynamically modify heat transfer capabilities associated with the heat sink system. Instead, the natural properties of the bimetallic materials in combination with the configuration of the implementation of such bimetallic materials into components of the heat sink provide the heat sink with such dynamic capabilities.

Embodiments of a heat sink system as described herein incorporate one or more thermostatic bimetallic materials into one or more portions or components of the heat sink, where each bimetallic material comprises a composite structure made of at least two metals, but can be two or more metals, having different coefficient of thermal expansion (CTE) values when subjected to a designated amount of heat. Generally, the coefficient of thermal expansion (CTE) of a material refers to a percentage of change in elongation or length of the material per degree of temperature change.

The bimetallic materials can be provided in any form or configuration that includes the two or more metals having different CTE values. In example embodiments, in which the bimetallic material forming a component or portion of a heat sink is generally planar (and, e.g., comprising a thin sheet or plate), the bimetallic material can be formed as a thin strip or sheet made of two or more layers, where each layer includes a different metal having a CTE value that differs from that of a metal in another layer. The differing metallic layers can be joined or bonded together at facing surfaces. The resultant composite bimetallic material formed of the different layers will exhibit distortion, such as bending, warping, bowing or curving at least partially along a surface of the bimetallic material when subjected to a designated change in temperature. This is due to at least one metal in the bimetallic material having a greater degree of elongation in relation to at least one other metal when the composite structure is heated above a designated temperature. A degree of distortion, such as a radius of curvature (along the entire length and/or width or along only a selected portion of the length and/or width) of the bimetallic material will be based upon the combination of two or more metals with different CTE values within layers of the bimetallic material as well as the temperature ranges to which the material is exposed. Some non-limiting examples of suitable metals having different CTE values that can be implemented into a bimetallic material composite structure for a heat sink component are iron, copper and aluminum. For example, a bimetallic composite structure can be formed comprising any combination of iron, copper and aluminum (i.e., iron/copper, iron/aluminum, copper/aluminum and iron/copper/aluminum). Graphene can also be incorporated within a bimetallic material (e.g., one or more bimetallic layers comprising a combination of graphene and copper) to achieve a distortion (e.g., warping or bending) of the structure incorporated such bimetallic material, which in turn can be configured within a heat sink to achieve desired changes in heat transfer performance between an IC component and the heat sink when the IC component and/or heat sink are heated above a threshold temperature.

Figure 1A:
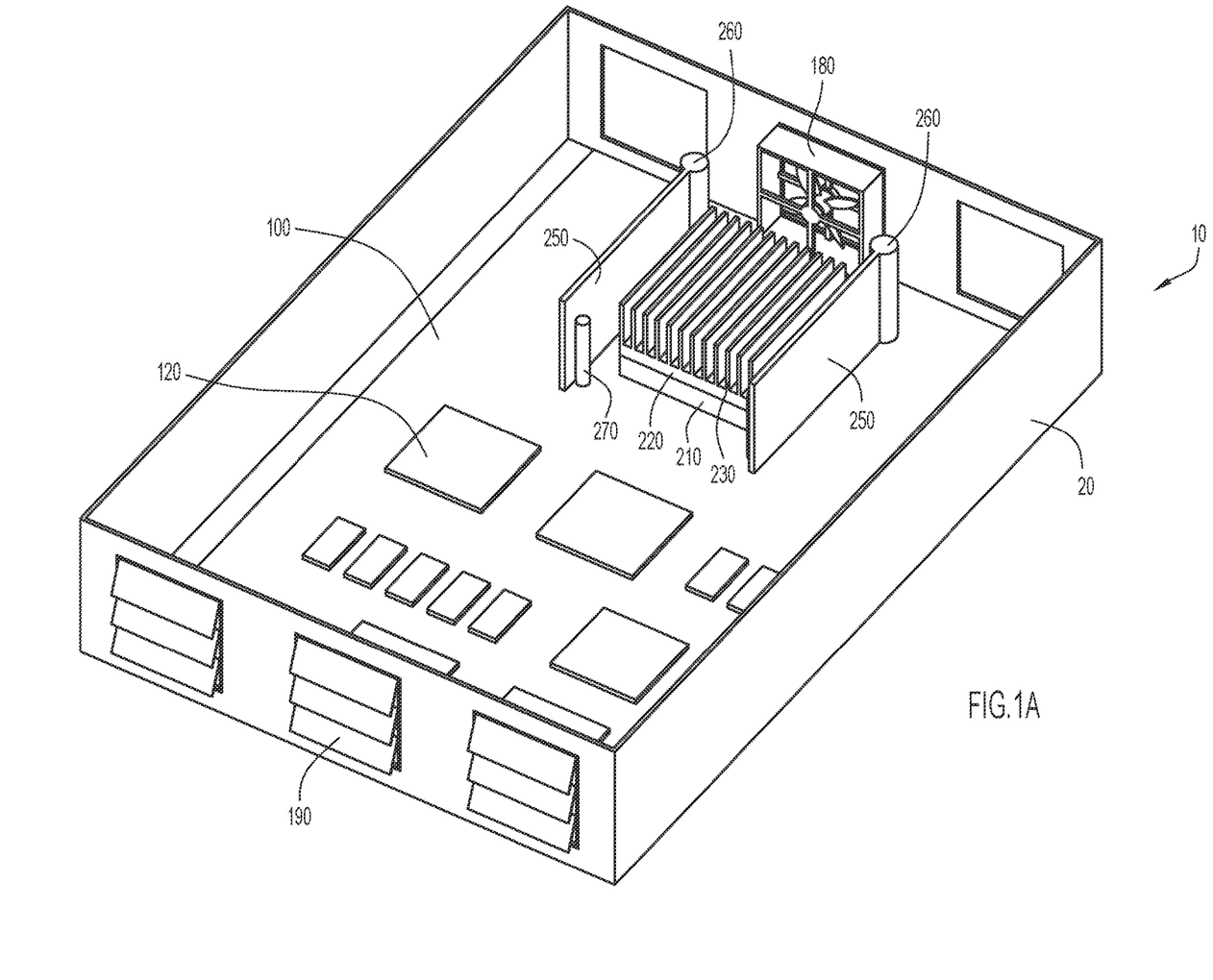
FIG. 1A is a schematic top view in perspective of an electronic device including a printed circuit board (PCB) with integrated circuit (IC) components and a heat sink that incorporates bimetallic material components comprising dividers to enhance airflow around IC components during operation in accordance with embodiments described herein.

In an example embodiment depicted in FIG. 1A, an electronic device 10 comprises a housing 20 that encloses a printed circuit board (PCB) 100. The electronic device can comprise a high speed router or switch, a networking device or any other type of computing device. The PCB 100 includes electronic components 120 disposed on a top surface and/or integrated with electrical wiring or traces within the board.

The electronic components can include high heat generating integrated circuit (IC) components such as an Application Specific Integrated Circuit Component (ASIC). Such IC components require cooling during operation to maintain the components within a desirable operating temperature range so as to prevent their failure thus ensuring continuous operation of the device. One or more heat sink systems, also referred to herein as heat sinks 150, can include components provided directly over each high heat generating IC component. The heat sinks 150 are operable to draw heat away from the IC component to maintain the IC component within a suitable temperature range during use. One or more fans 180 are also provided in-line with each heat sink 150 to assist in drawing heat away from the IC components. The fans provide a flow of air directed toward the IC components and heat sink components disposed directly over the IC components. Operation of the fans 180 can be controlled by a component 120 of the electronic device 10 to be operable based upon temperature measurements (e.g., via one or more sensors) at or near one or more of the high heat generating IC component. The housing 20 can also include any suitable number of air flow ventilation ports (e.g., grates or louvers disposed at one or more selected locations of one or more sidewalls of the housing, such as louvers 190 disposed in-line with fans 180) to permit airflow generated by the fans to be drawn through and removed from the housing 20. In example embodiments, the fans draw air through the housing by pulling air around the ASIC and/or other IC components and the heat sink, and then toward and through the fans and out of the housing (e.g., airflow path as shown by the wavy arrows in FIGS. 2A and 2B and in FIGS. 3A and 3B). Alternatively, the fans can draw air from the ambient environment surrounding the housing, pushing air into and through the housing, including forcing airflow from the fan toward and around the ASIC and/or other IC components and the heat sink (e.g., providing an airflow path that is opposite the wavy arrows shown in FIGS. 2A, 2B, 3A and 3B).

Figure 2A:
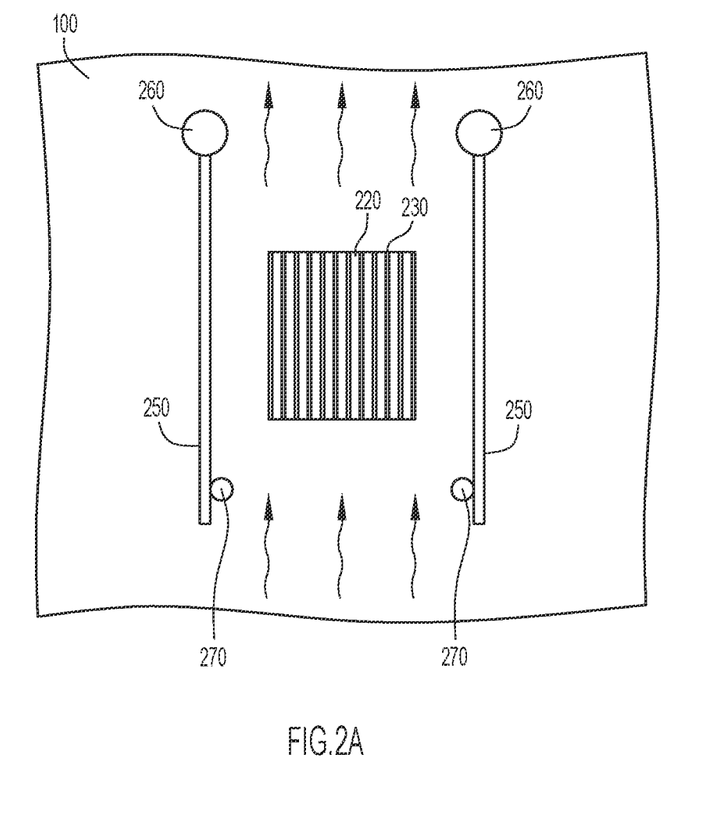
FIGS. 2A and 2B are enlarged views of a portion of the electronic device corresponding respectively with FIGS. 1A and 1B and further showing movement of bimetallic airflow diverters of the heat sink based upon temperature changes to the IC components.
Figure 2B:
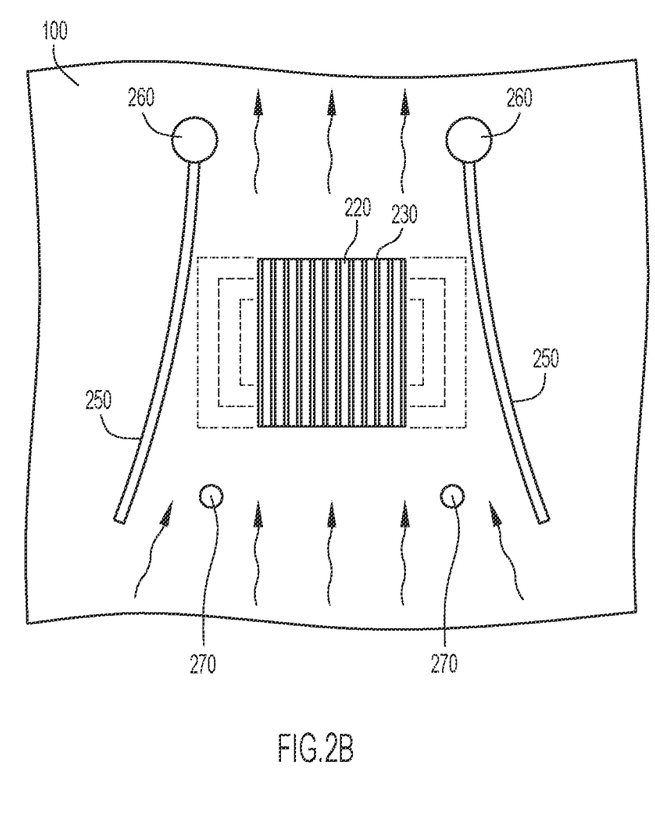

Referring to FIGS. 2A and 2B, an enlarged view of a portion of the PCB 100 is depicted including an ASIC 210 and a heat sink 150 disposed directly over the ASIC 210. The heat sink 150 includes a bottom plate or base plate 220 that lies adjacent a top surface of the ASIC 210. The base plate 220 is formed of a solid metal or other material having a suitable thermal conductivity (e.g., aluminum or copper)

that facilitates adequate heat transfer between the ASIC 210 and the base plate 220. In some embodiments, the base plate can be hollow and include a fluid having a suitable thermal conductivity that enhances heat transfer between the ASIC and the base plate.

Attached to and extending from the base plate 220 is a plurality of cooling fins 230, which also have a suitable thermal conductivity and can be made of the same or similar material as the base plate 220 (and can also be integral with the base plate, forming a unitary structure) to facilitate adequate heat transfer away from the ASIC 210. Each of the cooling fins 230 comprises a thin, plate shaped member oriented in the same or similar direction as the other fins (e.g., the cooling fins are oriented parallel with each other) in a lengthwise direction of airflow across the heat sink 150. The heat sink 150 is further aligned with a corresponding fan 180 such that the lengthwise (parallel) orientation of the cooling fins 230 is in the same or generally parallel direction as the airflow generated by the fan.

A pair of diverters 250 are provided for the heat sink 150, where each diverter 250 is provided so as to extend along and slightly spaced from one side of the heat sink in a direction that corresponds with the lengthwise direction of the cooling fins 230 and also the direction of airflow generated by the fan 180 that is aligned with the heat sink. Each diverter 250 comprises a thin plate or strip that attaches at one lengthwise edge of the strip to a suitable support structure 260 within the electronic housing 20. Each support structure 260 can comprise a post secured to the upper surface of the PCB 100 at or near the fan, or a power supply unit for the fan or any other suitable component arranged alongside or near the fan. The diverters 250 are also spaced apart from each other at a distance that corresponds with and can be slightly larger than a width dimension of a corresponding fan 180 so as to provide a barrier for airflow generated by the fan that directs the airflow across the ASIC 210 and/or heat sink 150. The diverters can also be suitably dimensioned to have a height that corresponds closely with (e.g., being slightly smaller than) sidewall dimensions and an overall height of the device housing 20. Accordingly, the diverters can be dimensioned and arranged within the housing 20 in relation to the ASIC 210 and heat sink 150 so as to define and control the airflow path of air generated by the fan 180 that is directed over and around the heat sink and the ASIC (as well as through the cooling fins of the heat sink).

Each diverter 250 extends in a cantilevered manner from the anchored or secured edge such that its opposing lengthwise edge is free and unsecured with any structure. The diverters 250 can further have suitable lengths so as to extend slightly beyond the ASIC 210 and/or the fins 230 of the heat sink 150. A support pin 270 or any other suitable structure can be provided at or near the free end of each diverter 250 so as to engage with an interior or ASIC facing side of the diverter to prevent further movement of the diverter free end in a direction toward the ASIC during operations as described herein.

Each diverter 250 includes at least a portion formed of a bimetallic composite material including a first layer comprising a first metal (e.g., iron) having a first CTE and a second layer comprising a second metal (e.g., copper or aluminum) having a second CTE. The first and second layers of the composite material are bonded or secured together. At lower temperatures, the composite material of each diverter is flat. However, when the temperature of the composite material increases beyond a threshold temperature so as to be within a designated temperature range, the composite material is distorted in shape. In particular, the composite material distorts in shape by arcing/curving, bowing or bending to an extent based upon the difference between the first and second CTE values for the first and second metals as well as other factors such as first and second layer thicknesses, amount of each of first and second metals provided in each layer, etc. Each divider can be formed entirely of the bimetallic composite material. Alternatively, only a portion of each diverter can be formed of the bimetallic composite material. For example, each diverter can include a first portion that is formed of a single metal material (e.g., iron) that will not bend within the elevated temperature range and also a second portion that is formed of the bimetallic composite material. The diverter can be oriented such that its first and second portions are arranged in any suitable manner in relation to the heat sink 150 (e.g., diverter oriented so that first portion is anchored at support structure 260 and second portion extends to free end of diverter, or vice versa).

In operation, when the ASIC 210 is performing within a lower temperature range, the diverters 250 have a generally straight configuration as shown in FIGS. 1A and 2A, where the free ends of the diverters engage support pins 270. Airflow generated by cooling fan 180 flows through a space or volume within the housing 20 that is defined between the fan outlet, the top and bottom walls of the housing 20, and the diverters 250 (which direct the airflow over and around the ASIC and/or heat sink). Such airflow is schematically depicted by the wavy arrows in FIGS. 2A and 2B.

Figure 1B:
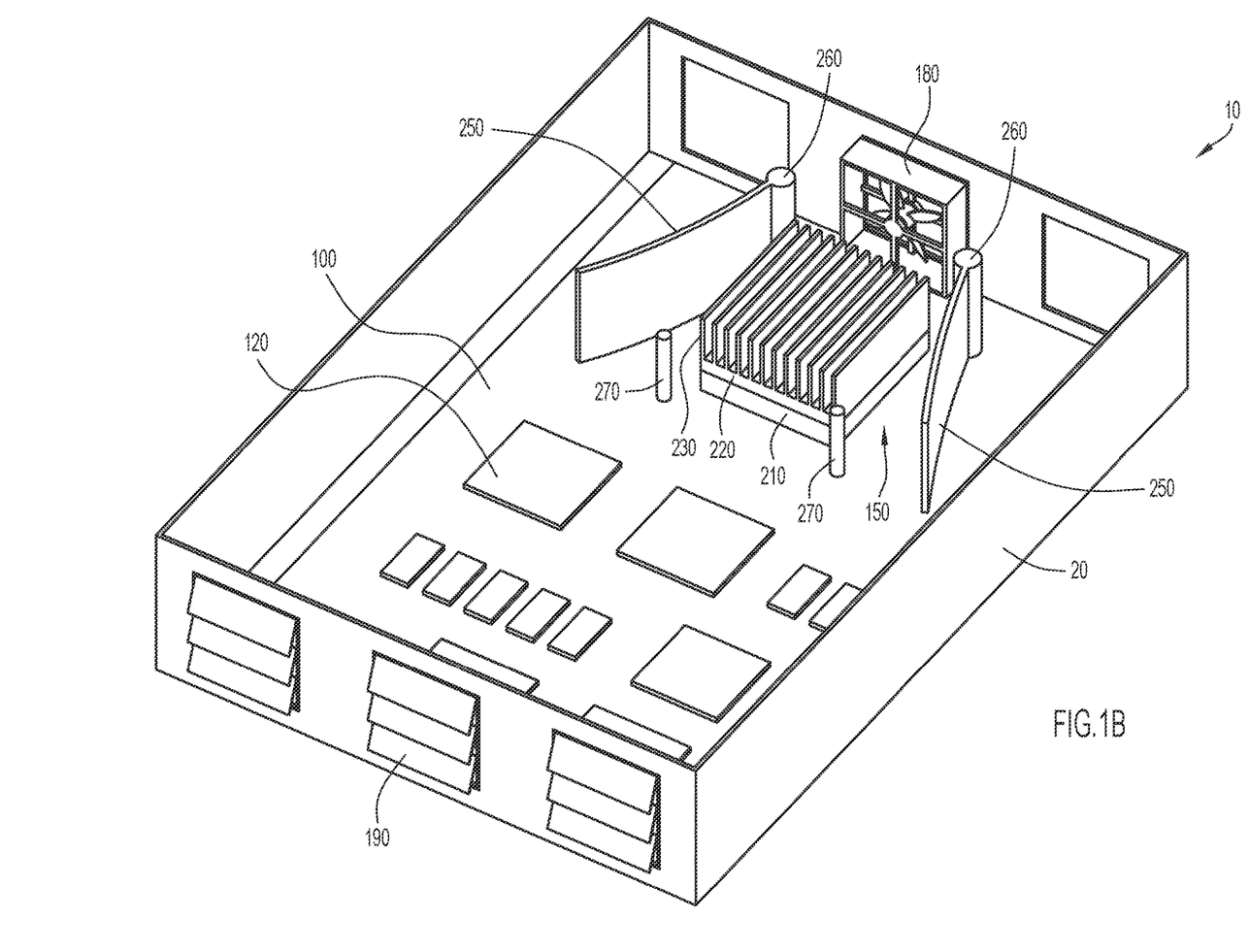
FIG. 1B is the top view in perspective of FIG. 1A, in which the dividers have moved outward to increase a volume of airflow to heat sink components.

During continued operations, the ASIC can start to heat up during high speed operations to an upper temperature range. In this upper temperature range, heat radiates from the ASIC 210 outward toward the diverters 250, causing the diverters 250 to increase in temperature above a threshold temperature such that the CTE differential between first and second metals of the composite material forming some or all of the diverters imparts a bending of the diverters to a designated degree of curvature. This is depicted in FIGS. 1B and 2B (with expanding dashed brackets in FIG. 2B representing outwardly radiating heat from the ASIC and heat sink toward the diverters), in which the diverters 250 bow or curve outward away from the ASIC 210 and the heat sink 150 so that the free end of each diverter moves away from its engagement with its corresponding support pin 270. The outward movement of the diverters (or portions of the diverters) from the ASIC and heat sink increases the space or volume between the diverters, thus increasing the airflow volume or CFU (cubic feet per minute) flow rate of air over and around the ASIC and/or heat sink. This in turn enhances heat transfer by the heat sink away from the ASIC during operation. When the temperature of the ASIC decreases to a level below the upper temperature range, the degree of curvature is reduced and the diverters straighten to their original positions as shown in FIGS. 1A and 2A, with the free ends of the diverters 250 moving in a direction back toward the ASIC 210 so as to engage with the support pins 270.

Thus, the temperature increase of the ASIC within a predetermined range (e.g., above a threshold temperature) imparts a dynamic change (based upon the physical characteristics of the bimetallic diverters) in an amount or volume of air being generated by the fan that is directed toward the heat sink components and ASIC. This in turn imparts a change in the heat transfer rate between the ASIC and the heat sink to enhance heat transfer from the ASIC so as to account for the increase in heat generated by the ASIC. In other words, enhanced performance of the heat sink occurs by increasing airflow volume across and around the ASIC and/or heat sink based solely upon the physical characteristics incorporated into the bimetallic diverters. This feature minimizes or alleviates the requirement of additional components (e.g., feedback sensors combined with fan speed controllers that increase or decrease fan speeds based upon sensor measurements) that can complicate operations and also present a potential point of failure for the device. When the temperature of the ASIC decreases (e.g., below the threshold temperature), airflow volume over, around and across the ASIC and/or heat sink can be reduced based solely upon the diverters changing (bending back) to their original (generally straight) configurations.

Figure 3A:
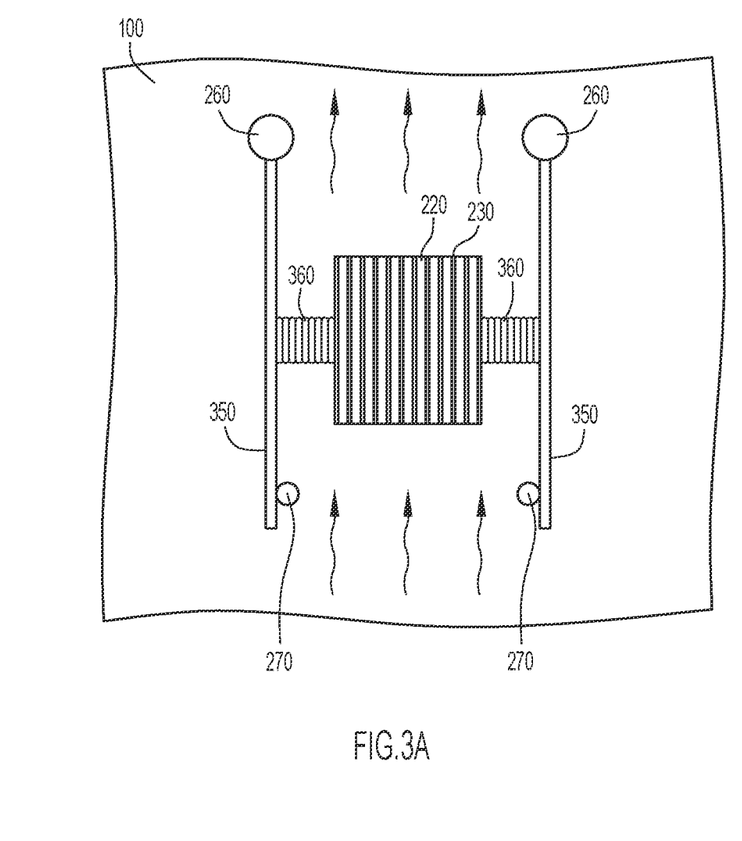
FIGS. 3A and 3B are enlarged views of a portion of the electronic device of FIG. 1A, including another embodiment of a heat sink with bimetallic materials that enhance airflow around IC components during operation in accordance with embodiments described herein.
Figure 3B:
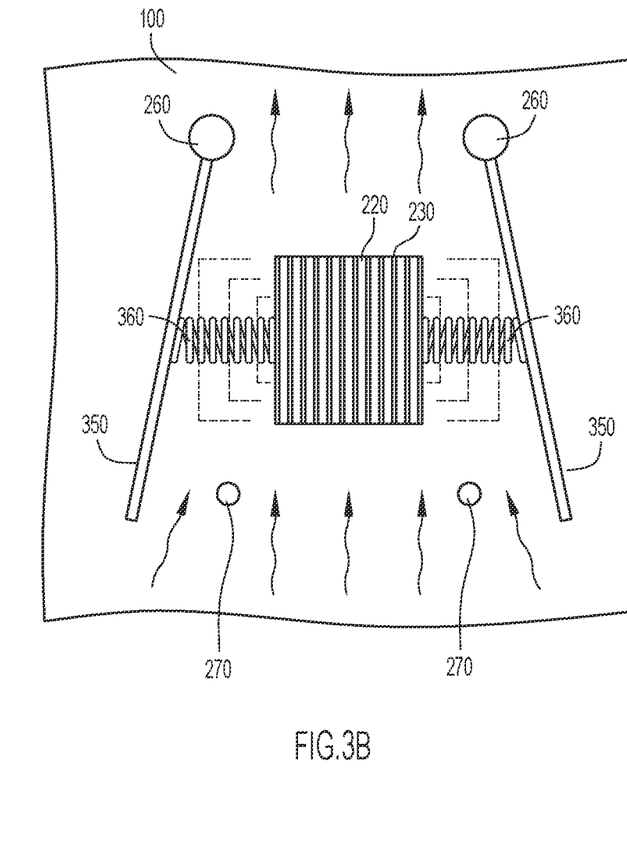

Another embodiment utilizing diverters with a heat sink is depicted in FIGS. 3A and 3B. In this embodiment, the diverters 350 have the same or similar size and shape and are oriented in the same or similar manner in relation to the ASIC 210 and heat sink 150 as the diverters previously described and depicted in FIGS. 2A and 2B. However, in this embodiment, the diverters are formed of a metal or other suitable material that is free of a bimetallic composite material. Instead, a pair of springs 360 are provided. Each spring 360 comprises a bimetallic composite material and extends between a first connection point at or near the ASIC 210 or the heat sink 150 and a second connection point at a corresponding diverter 350. The springs 360 can comprise a leaf spring in the form of a substantially flat strip of material that permits flexure of each spring. Alternatively, the springs 360 can have any other suitable shape that permits flexure of each spring. The bimetallic composite material forming each spring 360 includes first and second metals having different CTE values that facilitate outward flexure or increase in length of each spring when heated above a threshold temperature (e.g., within a designated upper temperature range) and inward flexure to a reduced or original length when each spring is reduced in temperature below the threshold temperature. Each diverter can be pivotally connected at its secured end with the support structure 260 to allow the diverters to pivot outward and away from the ASIC (thus increasing airflow volume in CFM from the fan 180 over and around the ASIC 210 and/or heat sink 150) when the ASIC increases heat output to warm the springs 360 above the threshold temperature (as shown in FIG. 3B). When the ASIC reduces heat output, the springs 360 pivot back inward toward the ASIC (reducing airflow volume in CFM) as the temperature of the springs drop below the threshold temperature (as shown in FIG. 3A).

Figure 4A:
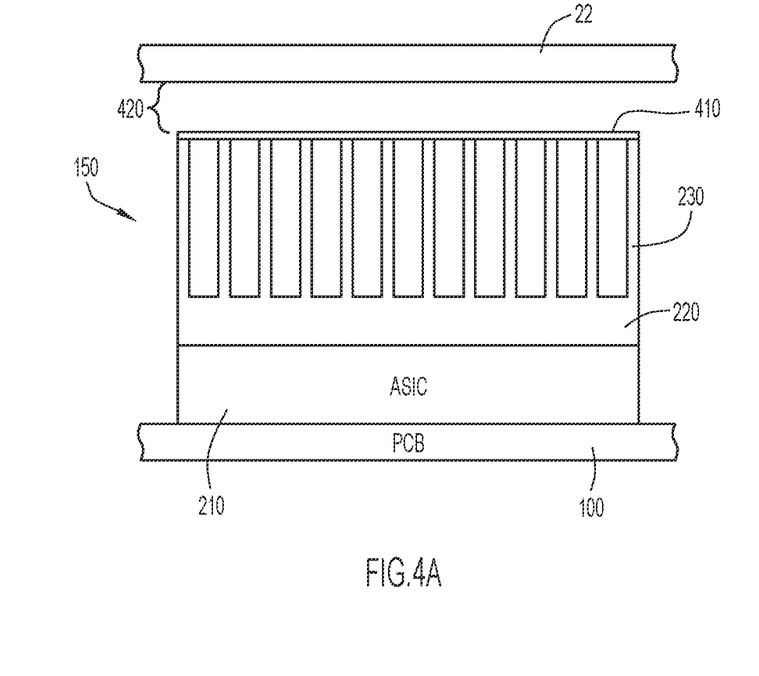
FIG. 4A is a partial view of an electronic device including a heat sink disposed over an IC component disposed on a PCB, where the view is taken in an airflow direction along a lengthwise direction of the heat sink fins.
Figure 4B:
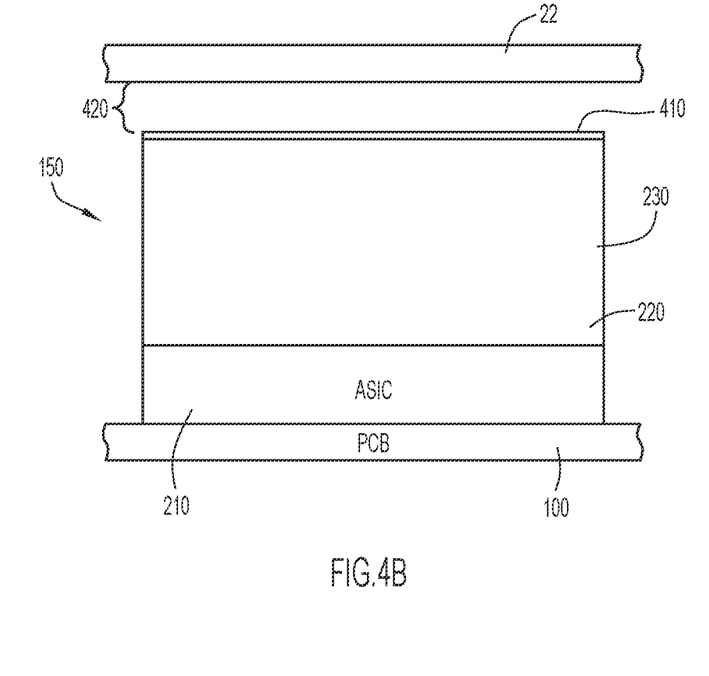
FIG. 4B is the partial view of the electronic device of FIG. 4A taken in a direction oriented orthogonal to the direction depicted in FIG. 4A (i.e., in a direction that is transverse the airflow direction in the lengthwise direction of the heat sink fins).
Figure 5A:
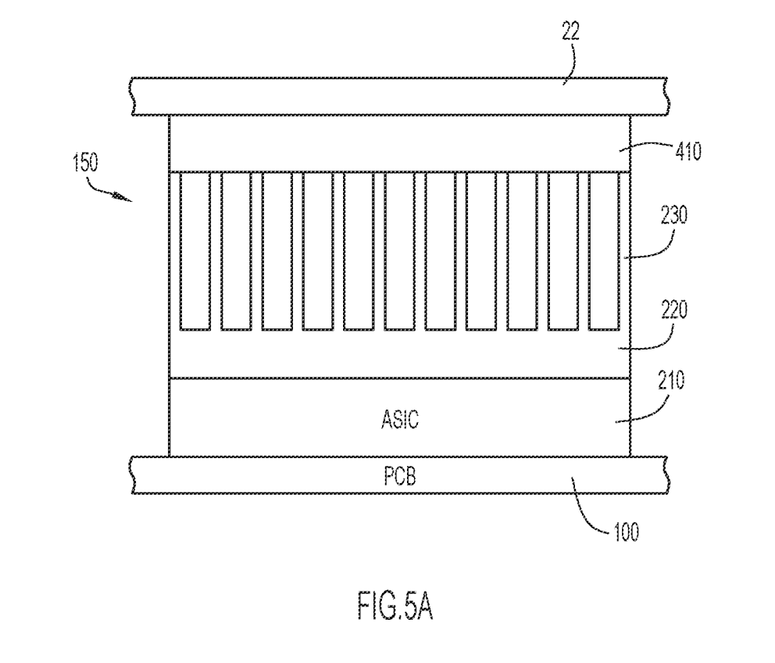
FIG. 5A is the partial view of the electronic device of FIG. 4A, taken in the same direction as FIG. 4A, and in which the bimetallic top plate of the heat sink which extends over the fins has bowed to close a gap between the heat sink and top cover of the electronic housing.
Figure 5B:
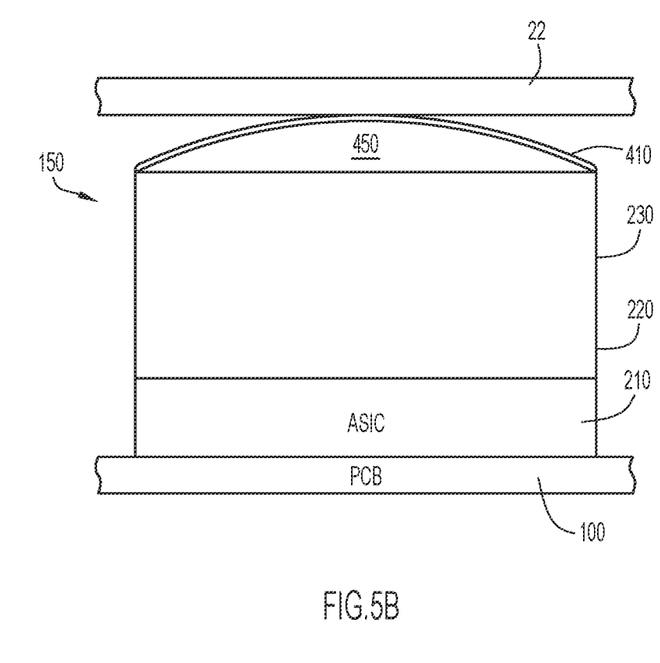
FIG. 5B is the partial view of the electronic device of FIG. 5A, taken in a direction oriented orthogonal to the direction depicted in FIG. 5A.
Figure 5C:
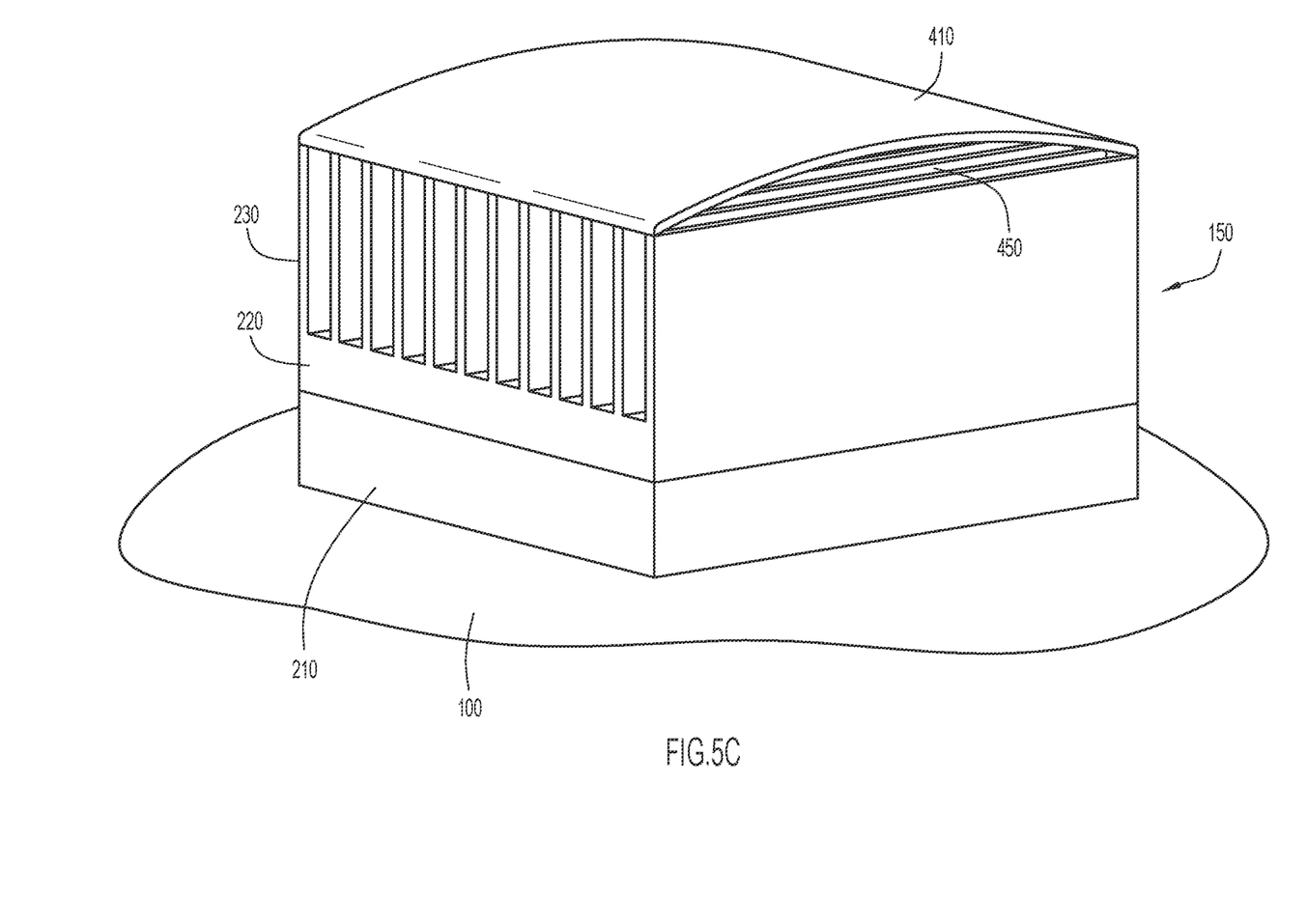
FIG. 5C is the partial view in perspective of the electronic device of FIG. 5A, in which the top cover of the housing is removed to clearly show features of the heat sink.

Another embodiment is depicted in FIGS. 4-5, in which the heat sink includes a top plate disposed over the cooling fins of the heat sink to dynamically enhance airflow and heat transfer between the heat sink and the ASIC during operations and changing temperatures of the ASIC. Referring to FIG. 4A and FIG. 4B, the heat sink 150 is configured in a similar manner as that described for the embodiment of FIGS. 2A and 2B and includes a base plate 220 disposed directly over an ASIC 210 that secures to a PCB 100.

In this embodiment, a top plate 410 is provided that is disposed over the fins 230. The top plate 410 is a generally flat and thin plate that comprises a bimetallic composite material including first and second metals having different CTE values (e.g., iron and copper, or iron and aluminum). In this embodiment, the dimensions of the heat sink components are configured such that, when the top plate 410 is in a flat configuration (as shown in FIGS. 4A and 4B), a distance or gap 420 exists between the upper surface of the top plate 410 and the top cover 22 of the housing 20.

As shown in FIGS. 4A and 4B, the top plate 410 can be secured at securing locations that are oriented at or near opposing ends of the top plate that correspond with the lengthwise ends of the cooling fins 230. The orientation of the top plate 410 in relation to the lengthwise orientation of the fins 230 combined with the securing of the ends of the top plate at the securing locations results in the bimetallic composite material bowing or curving upward and away from the fins between its secured ends when reaching and exceeding the threshold temperature (i.e., in the manner as shown in FIG. 5A, FIG. 5B and FIG. 5C). In this bowed or curved configuration, the top plate 410 extends upward in a direction away from the free ends/edges of the cooling fins 230 until a portion of the top plate (e.g., at its peak) contacts the top cover 22 of the housing 20. This in effect closes the gap 420 between the top plate 410 and the top cover 22 but also generates an air gap 450 between the top plate and the free ends/edges of the cooling fins 230, thus allowing a greater amount of airflow generated by the fan 180 to flow between the top or free ends/edges of the fins 230 and the top plate 410 (i.e., where the bowed top plate now allows airflow previously within the gap 420 to now move across the top edges of the fins). The greater amount of air generated by the fan toward and around the fins enhances heat transfer and more rapid cooling of the ASIC 210 that underlies the heat sink 150. When the temperature of the ASIC is reduced, resulting in a decrease of the temperature of the top plate 410 below the threshold temperature that activates bending of the bimetallic composite material, the top plate bends back to its flat configuration to reopen the gap 420 (as shown in FIGS. 4A and 4B).

While the top plate 410 is depicted as being secured at its opposing ends that are oriented in a direction of airflow generated by the fan (i.e., a dimension of the top plate 410 extending between its secured opposing ends is generally parallel with or in the same direction as the direction of airflow across or through the cooling fins 230), the top plate can also be secured in any other manner that causes bowing of the top plate against the top cover 22 of the housing 20 to modify airflow across or through the cooling fins. For example, the top plate 410 can also be secured at its opposing ends above the cooling fins 230 such that the dimension of the top plate extending between its secured opposing ends is transverse the direction of airflow across or through the cooling fins.

In still further embodiments, bimetallic composite materials can be incorporated into one or more of the cooling fins of the heat sink in any suitable manner to achieve dynamic change in heat transfer properties of the heat sink when a threshold temperature associated with the ASIC and/or heat sink is exceeded.

Figure 6A:
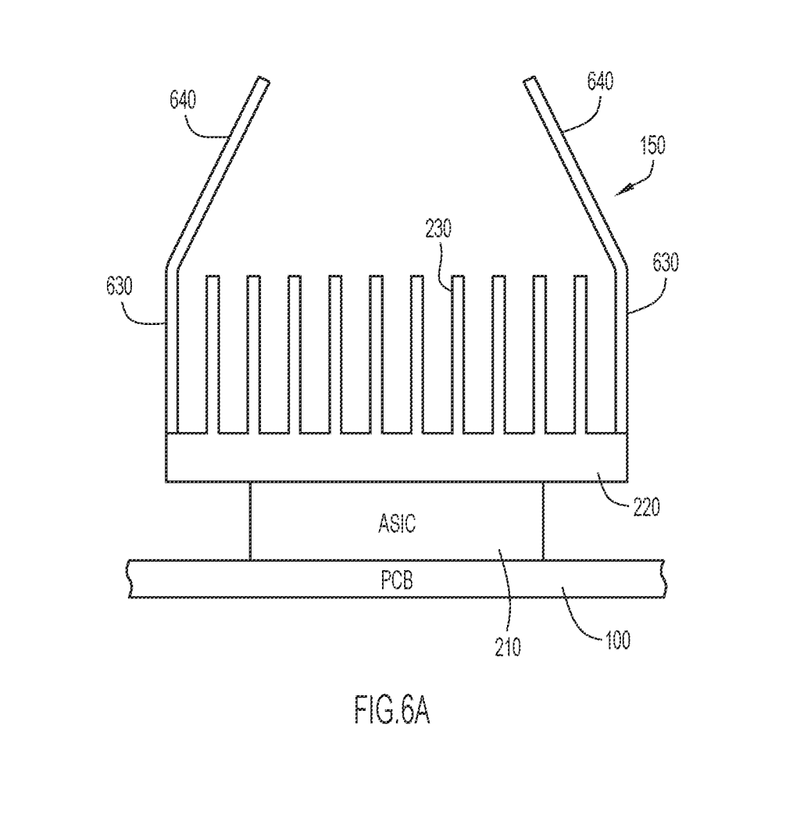
FIGS. 6A and 6B depict a partial view of an electronic device including a heat sink that includes bimetallic fins that operate to adjust airflow during operation of the device in accordance with embodiments described herein.
Figure 6B:
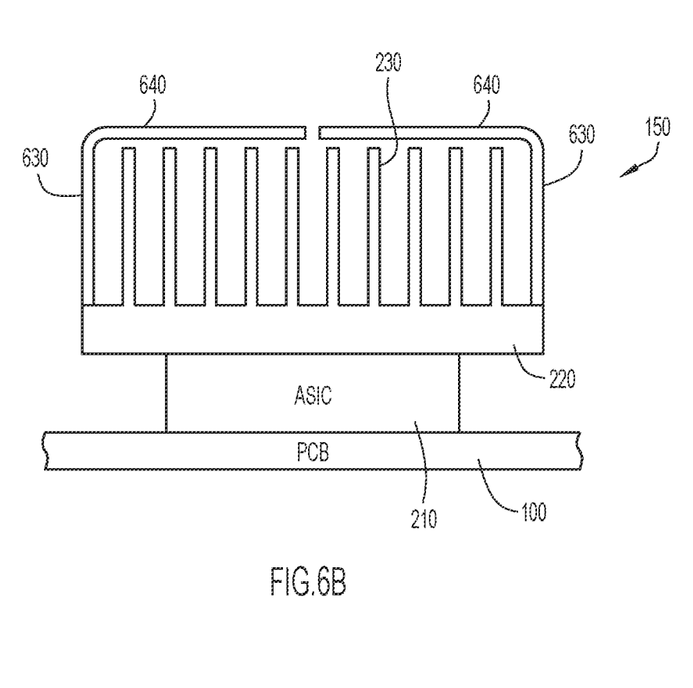

In the example embodiment of FIGS. 6A and 6B, the heat sink 150 includes two fins 630 including extended portions 640, where the fins 630 are located at opposing ends of the plurality of cooling fins 230. Each extended portion 640 comprising a bimetallic composite material that, when increasing to a temperature that exceeds a threshold temperature, bow or bend inward toward the upper ends of the fins 230 (e.g., the extended portions 640 bend inward from the position shown in FIG. 6A to the position shown in FIG. 6B when the threshold temperature is exceeded). The extended portions 640 bend back outward to their original positions when the temperature of these portions falls below the exceeded temperature. The change in orientations of the extended portions 640 provides dynamic change in heat transfer properties of the fins based upon temperature changes exhibited by the ASIC.

Figure 7A:
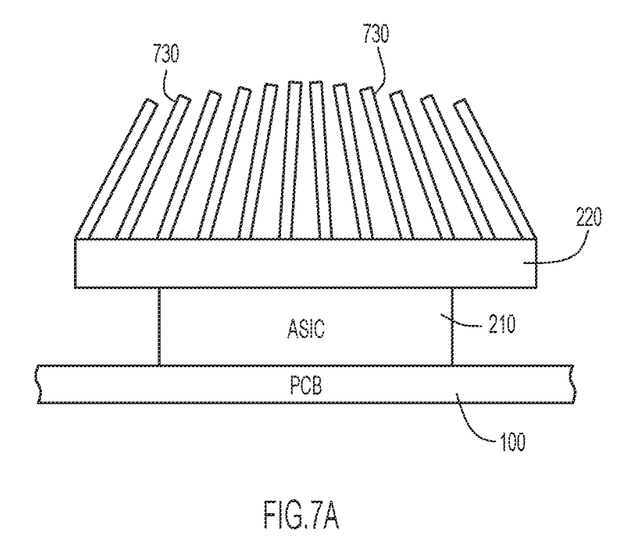
FIGS. 7A and 7B depict a partial view of an electronic device including another heat sink that includes bimetallic fins that operate to adjust airflow during operation of the device in accordance with embodiments described herein.
Figure 7B:
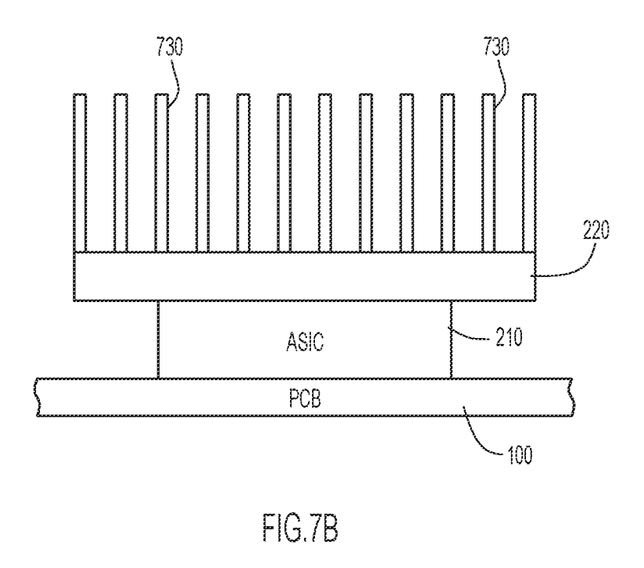

In another example embodiment depicted in FIGS. 7A and 7B, two or more cooling fins 730 can be formed of a bimetallic composite material, where the composite material changes the shape of each fin 730 when the fin temperature exceeds a threshold temperature. For example, the fins 730 can have a slightly bent or curved configuration as shown in FIG. 7A at a normal or lower temperature (i.e., below the threshold temperature), where the fins 730 bend inward toward each other. The fins 730 can be oriented such that a first group of fins located at and extending from one side of the base plate are bent in the same or similar inward direction toward a central region of the base plate, while a second group fins located at and extending from the other, opposing side of the base plate also extend in the same or similar inward direction toward the central region of the base plate and also toward the bending portions for the fins of the first group. When the fins 730 are heated above the threshold temperature, they can change shape in a similar manner as other fins in the same group. As shown in FIG. 7B, the shapes of the fins 230 of each group can change by straightening outward and away from each other imparting a substantially straight and upward extending configuration for all of the fins as shown in FIG. 7B.

In alternative embodiments, fins including bimetallic composite materials, can change in shape from a straight configuration to a slightly curved or bowed configuration when heated to a temperature that exceeds a designated threshold value. The change in shape of the cooling fins (e.g., changing from curved to straight), due to the bimetallic composite materials used to form a portion or all of each fin, dynamically changes the airflow across and around the fins of the heat sink to change the heat exchange rate between the ASIC and the heat sink. Further, cooling fin groups can be configured with different bimetallic composite materials such that the distortion or shape change and/or temperature threshold required to achieve such distortion or shape change for cooling fins of one group differs from that of another group of cooling fins, where the groups of cooling fins are oriented in any selected manner along the base plate to achieve a variety of different orientations and shapes of cooling fins to control and dynamically alter airflow across the fins based upon different temperature profiles associated with the ASIC (or other IC component) being cooled.

In other embodiments, an ASIC (or other IC component) may distort in shape due to changes in temperature of the ASIC during operations. For example, an ASIC may have a straight or slightly warped upper surface that changes in contour based upon temperature changes to the ASIC (e.g., the ASIC increases in temperature above a threshold temperature). In such scenarios, it may be desirable to maintain as much of the heat sink base plate in surface contact with the ASIC upper surface to ensure adequate heat transfer from the ASIC to the heat sink. The base plate can be formed with a bimetallic composite material that causes a lower surface of the base plate to complement and conform with the contour of the ASIC throughout the operational temperature ranges of the ASIC.

Figure 8A:
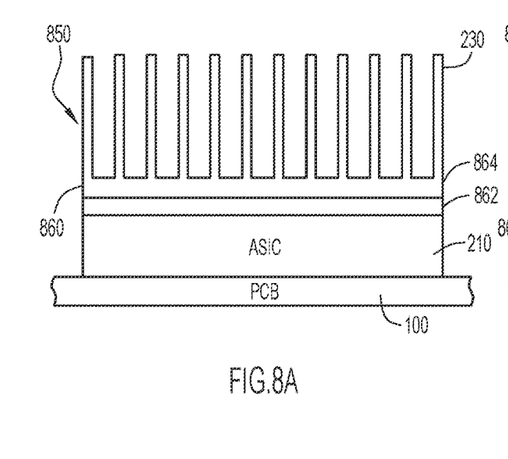
FIGS. 8A, 8B and 8C depict a side view of another embodiment of an electronic device including a heat sink disposed over an IC component, where a base plate of the heat sink comprises a bimetallic material that conforms to a changing contour of the IC component upper surface due to changes in temperature during operations.
Figure 8B:
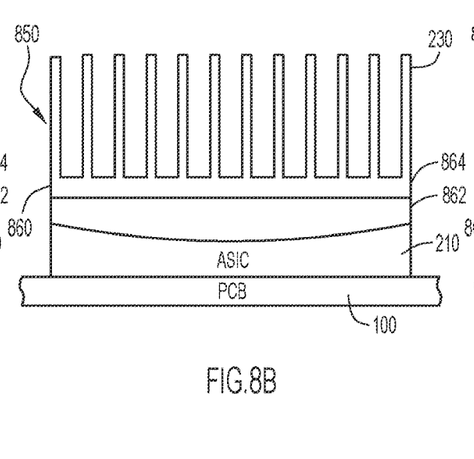
Figure 8C:
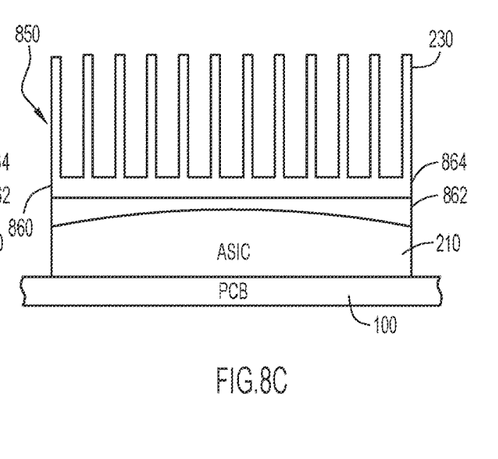

Referring to FIGS. 8A-8C, a heat sink 850 is provided over the ASIC 210 that includes a base plate 860 and fins 230 extending from the base plate. The base plate 860 includes a lower or first layer 862 comprising a bimetallic composite material and an upper or second layer 864 comprising a metal (e.g., copper or aluminum) that is the same or similar as the material forming the fins 230. The bimetallic composite material for the first layer 862 can comprise, e.g., a combination of iron and copper or aluminum, or a combination of copper and graphene. As shown in FIG. 8A, the upper surface of the ASIC 210 and lower (facing) surface of the first layer 862 of the base plate 860 are in contact with each other, with each surface having a generally flat or planar configuration.

As the ASIC 210 changes in temperature during operations (e.g., dropping below a lower threshold temperature, or increasing above an upper threshold temperature), the ASIC top surface contour may change by either bowing inward to form a slightly concave shape (FIG. 8B) or bowing outward to form a slightly convex shape (FIG. 8C). The bimetallic composite material of the first layer 862 can be configured with suitable combinations of metals having different CTE values such that the lower surface of the first layer 862 complements the contour by bowing or warping in a manner opposite the changing contour of the ASIC top surface (i.e., the first layer lower surface bows outward forming a convex contour when the ASIC top surface bows inward forming a concave contour as shown in FIG. 8B, and the first layer lower surface bows inward forming a concave contour when the ASIC top surface bows outward forming a convex contour as shown in FIG. 8C).

Thus, the heat sink 850 is configured to maintain the same or substantially similar surface area contact between the base plate 860 and the ASIC 210 despite changing contouring of the ASIC across an operating temperature range.

As described herein, bimetallic composite materials can be incorporated into different components of the heat sink (e.g., cooling fins, base plate, top plate, etc.) as well as components associated with the heat sink (e.g., airflow diverters) to dynamically change and enhance airflow rate and/or heat transfer between a high heat generating IC component (e.g., an ASIC) and the heat sink during operations of the component that span a designated temperature range. In addition, the heat sink can include any one or combination of components comprising bimetallic composite materials of the types described herein. For example, a heat sink configuration for a device can include diverters with bimetallic composite materials and also any one or more other components of the heat sink (e.g., base plate, cooling fins and/or top plate) including bimetallic composite materials.

Thus, an example embodiment of an apparatus comprises a printed circuit board (PCB), an integrated circuit (IC) component connected with a surface of the PCB, and a heat sink. The heat sink comprises a base plate disposed directly over the IC component, and a plurality of cooling fins extending transversely from the base plate. The heat sink includes at least one component comprising a bimetallic material that distorts when heated above a threshold temperature so as to modify a flow of air directed toward and contacting the cooling fins or maintain contact between a surface of the IC component and a facing surface of the base plate.

The bimetallic material can comprise a composite structure formed of a first layer comprising a first metal connected with a second layer comprising a second metal, the first metal having a first coefficient of thermal expansion (CTE), and the second metal having a second coefficient of thermal expansion (CTE) that differs from a first CTE.

The first metal can comprise iron and the second metal can comprise copper or aluminum.

The heat sink can further comprise a diverter comprising the bimetallic material, the diverter extending along the PCB and oriented along one side of the IC component so as to control a direction of the flow of air toward the cooling fins, where the bimetallic material of the diverter bends when heated above the threshold temperature resulting in a change in volume of airflow across the cooling fins. The heat sink can also further comprise a second diverter comprising the bimetallic material, the second diverter extending along the PCB and oriented along another side of the IC component.

The heat sink can further comprise a top plate extending over the cooling fins, where the top plate is secured at opposing ends of the top plate in relation to the cooling fins, and the top plate comprises the bimetallic material such that the top plate bends between the opposing ends of the top plate so as to extend away from the cooling fins when heated above the threshold temperature. The bending of the top plate when heated above the threshold temperature can create an air gap between the top plate and top ends of the cooling fins.

A cooling fin of the plurality of cooling fins can also comprise the bimetallic material. The bimetallic material of the cooling fin can be disposed along an end portion of the cooling fin, and the end portion of the cooling fin can bend toward top ends of other cooling fins of the plurality of cooling fins when the end portion is heated above the threshold temperature.

The plurality of cooling fins can also comprise the bimetallic material. The plurality of cooling fins can include a first group of cooling fins and a second group of cooling fins, the cooling fins of the first group bend in a first direction, and the cooling fins of the second group bend in a second direction that opposes the first direction.

The base plate of the heat sink can also comprise the bimetallic material, where the bimetallic material forms a lower surface of the base plate that engages an upper surface of the IC component. The bimetallic material that forms the lower surface of the base plate can comprise a combination of copper with graphene or a combination of iron with copper or aluminum. An upper surface contour of the IC component can change when a temperature of the IC component increases, and a lower surface contour of the base plate can change to complement the upper surface contour of the IC component when the bimetallic material of the base plate is heated above the threshold temperature.

In another embodiment an apparatus comprises a printed circuit board (PCB), an integrated circuit (IC) component connected with a surface of the PCB, and a heat sink. The heat sink can comprise a base plate and a plurality of cooling fins disposed over the IC component, and a pair of diverters comprising a first diverter and a second diverter, each of the first and second diverters comprising a bimetallic material and extending along the PCB and oriented along a side of the IC component so as to control a direction of a flow of air between the first and second diverters toward the cooling fins. The bimetallic material of each of the first and second diverters can bend when heated above a threshold temperature so as to force a free end of the first diverter away from a free end of the second diverter to modify a flow of air directed toward and contacting the cooling fins.

The bimetallic material of each of the first and second diverters can comprise a composite structure formed of a first layer comprising a first metal connected with a second layer comprising a second metal, the first metal having a first coefficient of thermal expansion (CTE), and the second metal having a second coefficient of thermal expansion (CTE) that differs from a first CTE.

In a further embodiment, an apparatus comprises a printed circuit board (PCB), an integrated circuit (IC) component connected with a surface of the PCB, and a heat sink. The heat sink can comprise a base plate and a plurality of cooling fins disposed directly over the IC component, and a top plate extending over the cooling fins. At least one of the base plate and the top plate can comprise a bimetallic material that distorts when heated above a threshold temperature so as to enhance heat transfer between the IC component and the heat sink.

The top plate can be secured at opposing ends of the top plate in relation to the cooling fins, and the top plate can comprise the bimetallic material such that the top plate bends between the opposing ends of the top plate so as to extend away from the cooling fins when heated above the threshold temperature. Bending of the top plate when heated above the threshold temperature can create an air gap between the top plate and top ends of the cooling fins.

The base plate can comprises the bimetallic material, and the bimetallic material can form a lower surface of the base plate that engages an upper surface of the IC component.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a printed circuit board (PCB);
an integrated circuit (IC) component connected with a surface of the PCB; and a heat sink, the heat sink comprising:
a base plate disposed directly over the IC component;
a plurality of cooling fins extending transversely from the base plate; and
a diverter that extends along the PCB and is oriented along one side of the IC component so as to control a direction of a flow of air toward the cooling fins;
wherein: the heat sink includes at least one component comprising a bimetallic material that bends away from the base plate when heated above a threshold temperature so as to increase the flow of air directed toward and contacting the cooling fins or maintaining contact between a surface of the IC component and a facing surface of the base plate.

2. The apparatus of claim 1, wherein the bimetallic material comprises a composite structure formed of a first layer comprising a first metal connected with a second layer comprising a second metal, the first metal has a first coefficient of thermal expansion (CTE), and the second metal has a second coefficient of thermal expansion (CTE) that differs from the first CTE.

3. The apparatus of claim 2, wherein the first metal comprises iron and the second metal comprises copper or aluminum.

4. The apparatus of claim 1, wherein the diverter comprises the bimetallic material, and the bimetallic material of the diverter bends when heated above the threshold temperature resulting in a change in volume of airflow across the cooling fins.

5. The apparatus of claim 4, wherein the heat sink further comprises a second diverter comprising the bimetallic material, the second diverter extending along the PCB and oriented along another side of the IC component.

6. The apparatus of claim 1, wherein the heat sink further comprises:
a top plate extending over the cooling fins;
wherein the top plate is secured at opposing ends of the top plate in relation to the cooling fins, and the top plate also comprises the bimetallic material such that the top plate bends between the opposing ends of the top plate so as to extend away from the cooling fins when heated above the threshold temperature.

7. The apparatus of claim 6, wherein bending of the top plate when heated above the threshold temperature creates an air gap between the top plate and top ends of the cooling fins.

8. The apparatus of claim 1, wherein a cooling fin of the plurality of cooling fins also comprises the bimetallic material.

9. The apparatus of claim 8, wherein the bimetallic material of the cooling fin is disposed along an end portion of the cooling fin, and the end portion of the cooling fin bends toward top ends of other cooling fins of the plurality of cooling fins when the end portion is heated above the threshold temperature.

10. The apparatus of claim 8, wherein the plurality of cooling fins also comprise the bimetallic material.

11. The apparatus of claim 10, wherein the plurality of cooling fins includes a first group of cooling fins and a second group of cooling fins, the cooling fins of the first group bend in a first direction, and the cooling fins of the second group bend in a second direction that opposes the first direction.

12. The apparatus of claim 1, wherein the base plate also comprises the bimetallic material, and the bimetallic material forms a lower surface of the base plate that engages an upper surface of the IC component.

13. The apparatus of claim 12, wherein the bimetallic material that forms the lower surface of the base plate comprises a combination of copper with graphene or a combination of iron with copper or aluminum.

14. The apparatus of claim 12, wherein an upper surface contour of the IC component changes when a temperature of the IC component increases, and a lower surface contour of the base plate changes to complement the upper surface contour of the IC component when the bimetallic material of the base plate is heated above the threshold temperature.

15. An apparatus comprising:
a printed circuit board (PCB);
an integrated circuit (IC) component connected with a surface of the PCB; and a heat sink comprising:
a base plate and a plurality of cooling fins disposed over the IC component; and
a pair of diverters comprising a first diverter and a second diverter, each of the first and second diverters comprising a bimetallic material and extending along the PCB and oriented along a side of the IC component so as to control a direction of a flow of air between the first and second diverters toward the cooling fins;
wherein: the bimetallic material of each of the first and second diverters bends away from the base plate when heated above a threshold temperature so as to force a free end of the first diverter away from a free end of the second diverter to modify the flow of air directed toward and contacting the cooling fins.

16. The apparatus of claim 15, wherein the bimetallic material of each of the first and second diverters comprises a composite structure formed of a first layer comprising a first metal connected with a second layer comprising a second metal, the first metal has a first coefficient of thermal expansion (CTE), and the second metal has a second coefficient of thermal expansion (CTE) that differs from the first CTE.

17. An apparatus comprising:
a printed circuit board (PCB);
an integrated circuit (IC) component connected with a surface of the PCB; and
a heat sink, the heat sink comprising:
a base plate and a plurality of cooling fins disposed directly over the IC component;
a top plate extending over the cooling fins, and
a diverter comprising a bimetallic material and extending along the PCB and oriented along a side of the IC component so as to direct a flow of air toward the cooling fins;
wherein: the bimetallic material of the diverter bends away from the base plate when heated above a threshold temperature so as to increase the flow of air directed toward and contacting the cooling fins; and at least one of the base plate and the top plate also comprises the bimetallic material so as to distort the at least one of the base plate and the top plate when heated above a threshold temperature thereby enhancing heat transfer between the IC component and the heat sink.

18. The apparatus of claim 17, wherein the top plate is secured at opposing ends of the top plate in relation to the cooling fins, and the top plate comprises the bimetallic material such that the top plate bends between the opposing ends of the top plate so as to extend away from the cooling fins when heated above the threshold temperature.

19. The apparatus of claim 18, wherein bending of the top plate when heated above the threshold temperature creates an air gap between the top plate and top ends of the cooling fins.

20. An apparatus comprising:
a printed circuit board (PCB);
an integrated circuit (IC) component connected with a surface of the PCB; and
a heat sink, the heat sink comprising:
a base plate and a plurality of cooling fins disposed directly over the IC component; and
a top plate extending over the cooling fins; and
a diverter comprising a bimetallic material and extending along the PCB and oriented along a side of the IC component so as to direct a flow of air toward the cooling fins;
wherein: the bimetallic material of the diverter bends away from the base plate when heated above a threshold temperature so as to increase the flow of air directed toward and contacting the cooling fins; and
the base plate also comprises the bimetallic material, the bimetallic material of the base plate forms a lower surface of the base plate that engages an upper surface of the IC component, and the bimetallic material of the base plate distorts the base plate when heated above the threshold temperature thus enhancing heat transfer between the IC component and the heat sink.

* * * * *